United States Patent
Ufert

(10) Patent No.: US 7,345,295 B2
(45) Date of Patent: Mar. 18, 2008

(54) SEMICONDUCTOR MEMORY

(75) Inventor: Klaus-Dieter Ufert, Unterschleissheim (DE)

(73) Assignee: Infineon Technologies AG, Munich (DE)

( * ) Notice: Subject to any disclaimer, the term of this patent is extended or adjusted under 35 U.S.C. 154(b) by 180 days.

(21) Appl. No.: 11/223,146

(22) Filed: Sep. 12, 2005

(65) Prior Publication Data

US 2006/0076549 A1    Apr. 13, 2006

(30) Foreign Application Priority Data

Sep. 24, 2004   (DE) .................. 10 2004 046 392

(51) Int. Cl.
*H01L 47/00*   (2006.01)
*H01L 35/24*   (2006.01)
*H01L 51/00*   (2006.01)

(52) U.S. Cl. ............................ 257/3; 257/40

(58) Field of Classification Search ............... 257/2–5, 257/40
See application file for complete search history.

(56) References Cited

U.S. PATENT DOCUMENTS

| | | | |
|---|---|---|---|
| 6,348,365 B1 | 2/2002 | Moore | |
| 6,703,652 B2 | 3/2004 | Van Brocklin | |
| 6,777,705 B2 * | 8/2004 | Reinberg et al. | ........... 257/2 |
| 2003/0209971 A1 | 11/2003 | Kozicki | |
| 2004/0159835 A1 | 8/2004 | Krieger | |

FOREIGN PATENT DOCUMENTS

| | | |
|---|---|---|
| DE | 69510337 T2 | 12/1999 |
| DE | 10245554 A1 | 4/2004 |
| WO | WO-90/00817 A1 | 1/1990 |

* cited by examiner

*Primary Examiner*—Cuong Nguyen
(74) *Attorney, Agent, or Firm*—Slater & Matsil, L.L.P.

(57) ABSTRACT

The object of providing a non-volatile semiconductor memory that stands out by good scalability and a high retention time as well as ensures low switching voltages at low switching times and achieves a great number of switching cycles at good temperature stability is solved by the present invention with a semiconductor memory whose memory cells comprise at least one silicon matrix material layer with open or disturbed nanocrystalline or amorphous network structures and structural voids which has a resistively switching property between two stable states, utilizing the ion drift in the silicon matrix material layer. The memory concept suggested in the present invention thus offers an alternative to the flash and DRAM memory concepts since it is not based on the storing of charges, but on the difference of the electric resistance between two stable states that are caused by the mobility of ions in the amorphous silicon matrix material with an externally applied electric field.

14 Claims, 1 Drawing Sheet

SEMICONDUCTOR MEMORY

CLAIM FOR PRIORITY

This application claims priority to German Application No. 10 2004 046 391.1, filed Sep. 24, 2004, which is incorporated herein, in its entirety, by reference.

TECHNICAL FIELD OF THE INVENTION

The invention relates to a semiconductor memory, in particular a non-volatile semiconductor memory with resistively switching memory cells. The invention further relates to a method for manufacturing a non-volatile, resistively switching memory cell.

BACKGROUND OF THE INVENTION

In a semiconductor memory device, a cell field consisting of a plurality of memory cells and a matrix of column and row supply lines or word and bit lines, respectively, is usually built up. These supply lines consist of electrically conducting material, with the actual memory cell being positioned at the crosspoints of the supply lines. To perform a change of the information content in a particular memory cell at the addressed crosspoint or to recall the content of the memory cell, the corresponding word and bit lines are selected and impacted either with a write current or with a read current. To this end, the word and bit lines are controlled by appropriate control means and controllers.

A plurality of kinds of semiconductor memories are known, e.g. a RAM (Random Access Memory) comprising a plurality of memory cells that are each equipped with a capacitor which is connected with a so-called selection transistor. By selectively applying a voltage at the corresponding selection transistor, it is possible to store electric charge as an information unit (bit) in the capacitor during a write process. This information content can be recalled again during a read process via the selection transistor.

A RAM memory device is a memory with optional access, i.e. data can be stored under a particular address and can be read out again under this address later. Since it is intended to accommodate as many memory cells as possible in a RAM memory device, one has been trying to realize or scale same as simple as possible and on the smallest possible space.

Another kind of semiconductor memories are SRAMs (Static Random Access Memory), the memory cells of which each comprise a number of, for instance, 6 transistors. Contrary to this, the memory cells of so-called DRAM (Dynamic Random Access Memory) semiconductor memories comprise in general only one single, correspondingly controlled capacitive element, e.g. a trench capacitor, with the capacitance of which one bit each can be stored as charge. This charge, however, remains for a relatively short time only in a DRAM memory cell, so that a so-called "refresh" must be performed regularly, e.g. approximately every 64 ms, wherein the information content is written in the memory cell again. In contrast to that, no "refresh" has to be performed in the case of SRAMs since the data stored in the memory cell remain stored as long as an appropriate supply voltage is fed to the SRAM. In the case of non-volatile memory devices (NVMs), e.g. EPROMs, EEPROMs, and flash memories, the stored data remain, however, stored even when the supply voltage is switched off.

In real systems of non-volatile memory devices, the stored charge, however, will not remain in the capacitor for any long time, which may result in a loss of information. Due to the scaling of modern semiconductor memory devices, the reasons for the loss of information are, on the one hand, based on basic physical effects such as the scattering of charge carriers, the recombination at defective places, and interaction effects. On the other hand, the loss of information is also caused by so-called leaking paths that are generated during the manufacturing or processing of the memory devices, e.g. unsaturated bonds at interfaces between different materials as well as differing structure dimensions due to process fluctuations.

In both cases, these leaking paths result in that the information stored in the capacitor has to be renewed in time before it is lost. The time span, during which sufficiently many charge carriers remain in the capacitor so that they can be read out as the same information as they were written in, is referred to as "retention time".

The presently established semiconductor memory technologies are consequently based primarily on the principle of charge storage in materials produced by standard CMOS (complement metal oxide semiconductor) processes. The problem of the leaking currents in the memory capacitor existing with the DRAM memory concept, which results in a loss of charge, has so far been solved insufficiently only by the permanent refreshing of the stored charge. The flash memory concept underlies the problem of limited write and read cycles with barrier layers, wherein no optimum solution has been found yet for the high voltages and the slow read and write cycles. Furthermore, the above-mentioned memory concepts (charge trapping, flash and DRAM memories) will, due to their functioning that is based on the storing of charges, presumably meet with physical scaling limits within foreseeable time. Furthermore, in the case of the flash memory concept, the high switching voltages and the limited number of read and write cycles, and in the case of the DRAM memory concept the limited duration of the storage of the charge state constitute additional problems that have not been solved optimally so far.

SUMMARY OF THE INVENTION

The present invention provides a non-volatile semiconductor memory that stands out by a good scalability ("nanoscale dimensions") and a high retention time. The present invention also provides a non-volatile semiconductor memory device that guarantees low switching voltages at low switching times and achieves a great number of switching cycles with good temperature stability.

In accordance with one embodiment the present invention, there is a semiconductor memory having a number of memory cells that are each arranged at the crosspoints of a memory cell matrix constructed of electric supply lines, wherein the memory cell is connected with the supply lines via electrodes and comprises a plurality of material layers between the electrodes. The memory cell according to the invention comprises at least one silicon matrix material layer with open or disturbed nanocrystalline or amorphous network structures and structural voids, which has a resistively switching property between two stable states, utilizing the ion drift in the silicon matrix material layer.

The memory concept suggested in the present invention thus offers an alternative to the flash and DRAM memory concepts and avoids the above-mentioned problems of known technologies. The memory concept according to the invention is not based on the storage of charges, but on the difference of the electric resistance between two stable states that is caused by the mobility of ions in an amorphous silicon matrix material that is compatible to CMOS material (complement metal oxide semiconductor) in an externally applied electric field. The electric field is preferably generated by the electric currents in the supply lines of the memory cell field.

Solid body materials generally have relatively low ion conductivity. In exceptional cases, with the good and rapid ion conductors, a high mobility of the ions is achieved at higher temperatures of over 100° C.

By means of specific manufacturing processes, so-called disturbed materials with particularly open or strongly disturbed nanocrystalline or amorphous network structures may be generated, which stand out by structural voids. With respect to the mobility of the ions or the ion conduction, respectively, such materials with disturbed structures offer the advantage that the structural spacings may be utilized as channels for good and rapid ion conduction.

Such disturbed structures may, for instance, be adjusted reproducibly in the amorphous network of Si:H, Si:H, C, or Si:H, O layers, micromorphous or microcrystalline silicon layers in that, in the plasma-supported CVD (chemical vapor deposition), by deposition with silane (SiH4) as a reactive gas, such a high silane flow is adjusted that negatively charged SiH . . . SiH4 particle conglomerates are formed in the plasma.

These particle conglomerates are deposited on the substrate and hence influence the growth conditions such that a strongly disturbed, porous, void-rich layer with numerous structural voids is created. In the extreme case, the particles can, by means of silane gas flow and the fed plasma performance, be adjusted controllably to a size of 2 to 3 nm. The particles of this size that are deposited on the substrate may, in a subsequent process step, be conglomerated to form a strongly porous layer without intermediate ventilation in the same reactor in a short-time plasma tempering step. It is known that alkali ions are capable of diffusing well in relatively void-poor amorphous silicon and silicon oxide layers (SiOx layers with x=1 . . . 2) already. This ion mobility is distinctly increased by the specific adjustment of the porosity, so that the ion mobility is substantially improved and the ion types that may be used are not just restricted to alkali ions with a small ion diameter.

Based on this good ion conductivity in the void-rich, porous, amorphous, micromorphous or microcrystalline silicon matrix, a bistable memory device can be produced in accordance with the present invention, the bistable memory device being adapted to assume two stable states with sufficiently differing high resistances under the influence of an electric field. A substantial advantage of the inventive memory cell vis-à-vis known memory concepts consists in the absolute compatibility of the matrix material and the deposition processes with CMOS process technology and in the comfortable and specific controllability of the porosity or size and density, respectively, of the structure voids in the chemically inert and amorphous, micromorphous or microcrystalline silicon matrix.

While the matrix material is deposited by means of plasma-supported CVD (chemical vapor deposition) with silane as a reactive gas and is subsequently tempered depending on the size of the plasma particles, the different ion materials may be deposited preferably by means of magnetron sputtering of a connection or element target and diffused in by means of photo diffusion.

The memory mechanism in the inventive concept is consequently based on the mobility of ions such as metal, alkali and earth alkali ions in a chemically inert, high-resistance matrix that is adapted to be scaled to nanometer dimensions. Starting out from a deposition of the movable positive ions in a region with high concentration in the matrix close to a temperature-resistant, chemically inert metal electrode (Mo, W or TiN), the memory cell is in a high-resistance state that is determined by the resistance of the silicon matrix, which usually ranges above $10^7$ Ωcm.

By applying a negative voltage pulse at the counter electrode, the ions are accelerated through the high-resistance amorphous, micromorphous or microcrystalline silicon diffusion matrix in the direction of the counter-electrode. This results in a state whose electric resistance is determined by the conducting ion path which is by at least two dimensions lower. This way, either a high-resistance or a low-resistance state may be generated. These states may be assigned to a logic "One" or a logic "Zero", which serves as a basis for binary data processing.

The high-resistance silicon matrix is chemically inert and is preferably provided with the void-rich, porous layer structure. This structure may also have been formed by conglomerated nanoparticles, and the ion movement in the silicon matrix may be effected by channel-like, open regions in the structure. The specifically adjustable size of the structural voids in the silicon matrix or the degree of porosity of the silicon matrix, respectively, enables the use of different kinds of ions. Thus, in the case of structural voids with smaller dimensions, alkali ions may, for instance, be used, or in the case of conglomerated nanoparticle layers, metal ions may be used.

Due to the chemically inert behavior of the silicon matrix, relatively short switching times are achieved, and low programming voltages are achieved due to the layer thickness of the silicon matrix in the nanometer range. The lateral diffusing of the alkali ions out of the amorphous, micromorphous and microcrystalline silicon matrix material is preferably prevented by process-compatible diffusion barriers such as a silicon nitride or oxynitride layer.

BRIEF DESCRIPTION OF THE DRAWINGS

In the following, the invention will be explained in more detail by means of several preferred embodiments and the enclosed drawings. The drawings show.

DETAILED DESCRIPTION OF THE INVENTION

Figure 1:
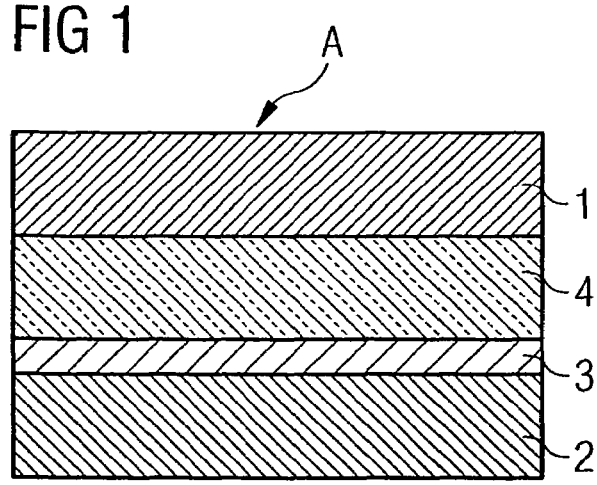
FIG. 1 shows a layer structure of a resistively switching memory cell A according to a first preferred embodiment of the present invention.

The memory cells A, B, C illustrated in the Figures are each arranged at the crosspoints of a memory cell matrix constructed of electric supply lines, i.e. column and row supply lines or word and bit lines, respectively. FIG. 1 shows a first preferred embodiment of the inventive non-volatile memory cell A having a resistively switching property on the basis of ion drift. According to a preferred embodiment of the present invention, the memory cell comprises a layer structure in sandwich geometry and is composed at least of the following layers:

In a first preferred embodiment of the present invention, the resistively switching, non-volatile memory cell comprises a first electrode 1 that is preferably manufactured of a chemically inert and refractory element such as Ti, TiN, Mo, or W;
an amorphous, micromorphous or microcrystalline silicon matrix material layer 4 doped with alkali, earth alkali, or metal ions;
a layer 3 serving as an ion reservoir; and
a second electrode 2, e.g. of Ti, TiN, Mo, W.

The amorphous, micromorphous or microcrystalline silicon material 4 used in the first embodiment preferably comprises one of the following compounds: amorphous Si:H, amorphous Si:C,H, amorphous Si:H,O, µc-Si, or SiOx (x=1 . . . 2), wherein other (foreign) components may also be added as alloys, e.g. amorphous Ge:H or materials derived therefrom.

Figure 2:
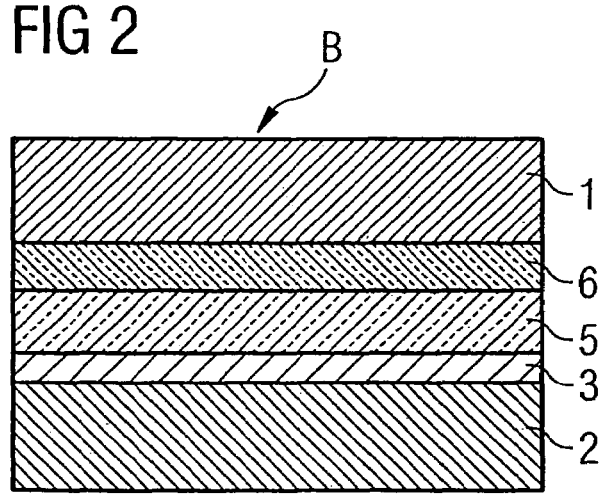
FIG. 2 shows a layer structure of a resistively switching memory cell B according to a second preferred embodiment of the present invention.

FIG. 2 shows the schematic layer structure of a second preferred embodiment of the inventive non-volatile memory cell B that has a resistively switching property on the basis of ion drift. According to this second preferred embodiment, the resistively switching, non-volatile memory cell comprises—instead of the amorphous, micromorphous or microcrystalline silicon matrix material layer 4 doped with alkali, earth alkali or metal ions—a double layer 5, 6 with a strongly ion-doped silicon layer 5 and a silicon layer 6 that is non-doped with respect to highly movable alkali, earth alkali and metal ions.

Consequently, the resistively switching, non-volatile memory cell B comprises, in a second preferred embodiment of the invention, a first electrode 1 manufactured preferably of a chemically inert and refractory metal such as Ti, TiN, Mo, or W;
a strongly ion-doped silicon layer 5;
a non-doped silicon layer 6;
a layer 3 serving as an ion reservoir; and
a second electrode 2, e.g. of Ti, TiN, Mo, W.

Figure 3:
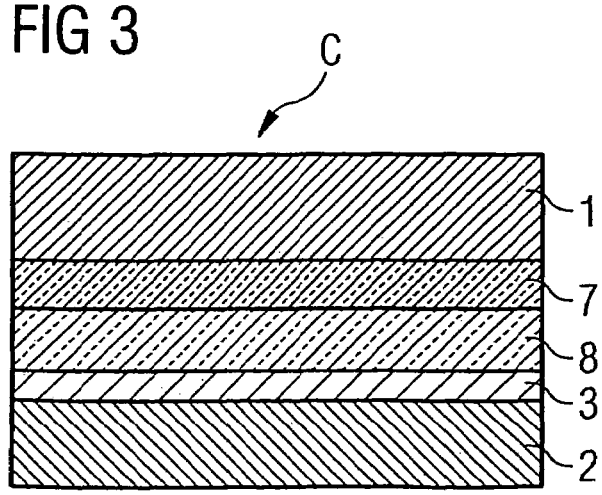
FIG. 3 shows a layer structure of a resistively switching memory cell C according to a third preferred embodiment of the present invention.

FIG. 3 is a schematic representation of the layer structure of a third preferred embodiment of the inventive non-volatile memory cell C having a resistively switching property on the basis of ion drift. In accordance with this third preferred embodiment of the present invention, the resistively switching, non-volatile memory cell comprises, between the first electrode 1 and the ion reservoir layer 3, a double layer 7, 8 with a silicon layer 8 that is strongly doped with respect to the movable ions and a weakly doped silicon layer 7.

Thus, the resistively switching, non-volatile memory cell C comprises, in a third preferred embodiment of the invention, a first electrode 1 manufactured preferably of a chemically inert and refractory metal such as Ti, TiN, Mo, or W;
a weakly doped silicon layer 7;
a strongly doped silicon layer 8;
a layer 3 serving as an ion reservoir; and
a second electrode 2, e.g. of Ti, TiN, Mo, W.

Alternatively, in this third embodiment, the double layer 7, 8 may also be designed as a single silicon layer comprising a doping profile that proceeds from strong doping to weak doping.

The inventive memory cell A, B, C is preferably manufactured by a CMOS process-compatible method. The layer arrangements described above may optionally be realized in horizontal or in vertical design on a semiconductor substrate and are independent both of the selected electrode materials and of the choice of an amorphous, micromorphous or microcrystalline silicon diffusion matrix. Electrode materials that generate an ohmic contact to amorphous Si-layers have already been known. The electrode materials are preferably manufactured of inert or refractory elements such as W, Mo, or Ti, which establish a good ohmic contact to the silicon matrix materials doped with highly movable ions.

According to a further aspect of the present invention, there is a method for manufacturing a resistively switching, non-volatile memory cell of the kind described above. In accordance with the invention, the above-described sandwiched layer structure of the resistively switching, non-volatile memory cell is manufactured as follows. Initially, a first electrode layer, for instance of Mo or W, is deposited on a substrate. This may be effected by means of a conventional sputtering method or by means of any other deposition method, e.g. by vaporization, PLD, or by means of a CVD method, etc. This material of the first electrode layer is filled in a hole that has been etched beforehand, and is then planarized by means of CMP (chemical mechanical planarization polishing). Alternative structuring methods such as deposition and subsequent etching may also be used in analogy.

Subsequently, the material layer of the first electrode is coated with a dielectric, and a hole is etched through this dielectric, so that the subsequently deposited silicon matrix material obtains a direct electrical contact to the electrode layer. The deposition of the silicon matrix material used with the above-described first embodiment is performed by means of a plasma-supported CVD method using silane as a reactive gas.

The strongly porous, amorphous, micromorphous or microcrystalline silicon layer that is generated by the deposition of nanoplasma particles is subsequently treated in a first tempering step, e.g. a plasma tempering step, under the influence of an inert gas at temperatures of up to 400° C. This first tempering step effects a compaction of the layers of the silicon matrix material that have been applied last, or of the uppermost layers, respectively, the silicon matrix material being available at least partially in a powder-like or porous state. As a doping material in the strongly porous silicon matrix material, alkali, earth alkali or metal ions may be selected for the highly movable ions.

The layer serving as an ion reservoir may be deposited by different methods such as magnetron sputtering, vaporization, or dispenser techniques. Subsequently, the ions of the doping material are diffused into the silicon matrix material layer in a further tempering step, for instance, by photo diffusion by means of UV light, or by a rapid tempering process RTP (rapid thermal processing). The performing of the second tempering steps results in that the doping material is diffused in particular into the surface layers of the silicon matrix material.

By suitable further process steps, the layer structure that has been manufactured this way may be completed e.g. by means of CMP methods or by etching and subsequent deposition of the second electrode. The possible diffusing of the ion material out of the Si matrix material may be prevented by means of encapsulation of the contact hole filled with silicon matrix material by a lateral diffusion barrier for the corresponding kinds of ions. Here, e.g. silicon nitride or oxynitride layers are suited as a lateral diffusion barrier.

LIST OF REFERENCE SIGNS

A resistively switching, non-volatile memory cell
B resistively switching, non-volatile memory cell
C resistively switching, non-volatile memory cell
1 first metal electrode
2 second metal electrode
3 ion reservoir layer
4 silicon matrix material doped with alkali, earth alkali or metal ions
5 strongly ion-doped silicon matrix material
6 non-doped silicon matrix material
7 weakly ion-doped silicon matrix material
8 strongly ion-doped silicon matrix material

What is claimed is:

1. A semiconductor memory, comprising:
   a number of memory cells each arranged at the crosspoints of a memory cell matrix constructed of electric supply lines that are connected with the memory cell via electrodes, the memory cell comprising:
      a plurality of material layers, and
      at least one silicon matrix material layer with open or disturbed nanocrystalline or amorphous network structures and structural voids, having a resistively switching property between two stable states, utilizing an ion drift in the silicon matrix material layer.

2. The semiconductor memory according to claim 1, wherein the silicon matrix material layer include a chemically inert and porous, amorphous, micromorphous or microcrystalline silicon matrix material with structure voids and has a bistable behavior due to its ion conductivity, such that the memory cell is adapted to assume two stable states with different mobility of ions available in the silicon matrix material layer and with different electric resistances under an influence of an electric field.

3. The semiconductor memory according to claim 1, wherein the structure of the silicon matrix material layer is formed by conglomerated nanoparticles and mobility of the ions in the silicon matrix material layer is effected by channel-like, open regions in the structure of the silicon matrix material layer.

4. The semiconductor memory according to claim 1, wherein structural gaps of the structural voids serve as channels for conducting the ions available in the silicon matrix material.

5. The semiconductor memory according to claim 1, wherein the silicon matrix material layer is doped with alkali, earth alkali and/or metal ions.

6. The semiconductor memory according to claim 1, wherein the material layers of the memory cell are arranged in one of a following positions: on top of each other, side by side, or in a sandwiched layer stack, on a semiconductor substrate.

7. The semiconductor memory according to claim 1, wherein the resistively switching, non-volatile memory cell comprises at least of the following material layers:
   a first electrode;
   an amorphous, micromorphous or microcrystalline silicon matrix material layer doped with alkali, earth alkali or metal ions;
   a layer serving as an ion reservoir; and
   a second electrode.

8. The semiconductor memory according to claim 1, wherein the resistively switching, non-volatile memory cell comprises at least of the following material layers:
   a first electrode;
   a strongly ion-doped silicon layer;
   a non-doped silicon layer;
   a layer serving as an ion reservoir; and
   a second electrode.

9. The semiconductor memory according to claim 1, wherein the resistively switching, non-volatile memory cell comprises at least of the following material layers:
   a first electrode;
   a weakly doped silicon layer;
   a strongly doped silicon layer;
   a layer serving as an ion reservoir; and
   a second electrode.

10. The semiconductor memory according to claim 9, wherein the double layer is alternatively designed as a single silicon layer comprising a doping profile that proceeds from strong doping to weak doping.

11. The semiconductor memory according to claim 1, wherein the amorphous, micromorphous or microcrystalline silicon material comprises amorphous Si:H, amorphous Si:C, H, amorphous Si:H, O, $\mu$c-Si, or $SiO_x$ (with x=1 . . . 2).

12. The semiconductor memory according to claim 1, wherein the electrodes are manufactured of inert and refractory elements.

13. The semiconductor memory according to claim 1, wherein the memory cell is manufactured by a CMOS process-compatible method.

14. A system with a memory device, comprising:
   at least one semiconductor memory with memory cells comprising:
      a plurality of material layers, and
      at least one silicon matrix material layer with open or disturbed nanocrystalline or amorphous network structures and structural voids, having a resistively switching property between two stable states, utilizing an ion drift in the silicon matrix material layer.

* * * * *

UNITED STATES PATENT AND TRADEMARK OFFICE
CERTIFICATE OF CORRECTION

PATENT NO. : 7,345,295 B2 Page 1 of 1
APPLICATION NO. : 11/223146
DATED : March 18, 2008
INVENTOR(S) : Ufert It is certified that error appears in the above-identified patent and that said Letters Patent is hereby corrected as shown below:

In Col. 8, line 3, after "least" delete --of--.
In Col. 8, line 12, after "least" delete --of--.
In Col. 8, line 20, after "least" delete --of--.

Signed and Sealed this

First Day of July, 2008

JON W. DUDAS
*Director of the United States Patent and Trademark Office*